United States Patent Office
3,516,346
Patented June 23, 1970

3,516,346

PHOTOLYTIC ETCHING OF NICKEL-CHROMIUM ALLOY

Donald L. Schaefer and James F. Burgess, Schenectady, N.Y., assignors to General Electric Company, a corporation of New York No Drawing. Filed Dec. 27, 1966, Ser. No. 604,602
Int. Cl. G03c 5/00
U.S. Cl. 96—36 3 Claims

ABSTRACT OF THE DISCLOSURE

A process is disclosed whereby nickel-chromium alloy surfaces and particularly thin supported films of the alloy may be selectively etched by exposing an interface between the alloy surface and an overlying photodecomposable reagent to activating radiation which produces chemically reactive species which attacks and preferentially etches the nickel-chromium alloy surface.

This invention relates to the etching of metallic nickel-chromium alloys in response to the impingement of activating radiation on the surface thereof and, more particularly, to the provision of a method for the etching of metallic nickel-chromium alloys in the form of thin films evaporated upon a supporting substrate by the reaction of photodecomposable reagents therewith in response to activating radiation upon an interface between the surface of said film and a medium containing said reagents. It should be noted at this point that the photoetching of other metals have been disclosed in the copending application Ser. No. 275,753, Gaynor, filed April 25, 1963 entitled "Metal Image Formation," now U.S. Pat. No. 3,346,384, granted Oct. 10, 1967 and in the application of Schaefer and Burgess, Ser. No. 604,541, filed concurrently herewith entitled "Photolytic Etching of Gold," now U.S. Pat. No. 3,482,976, granted Dec. 9, 1969, both assigned to the assignee of the present application.

BACKGROUND OF THE INVENTION

The use of nickel-chromium films for the electrically conductive paths in so-called printed circuit elements, particularly as electrically resistive paths in miniaturized circuits is known. This alloy is particularly useful for this purpose because it is readily vapor deposited on suitable substrates as electrically conductive thin films of uniform thickness which are chemically and physically stable. However, in order to produce the circuit pattern from these films it has been necessary to employ conventional photoresist etching procedures which have several inherent problems or difficulties. For example, the edge resolution achievable with these materials is of uncertain quality and difficult to reproduce from element to element. During processing, considerable care must be exercised to prevent the residual photoresist pattern from lifting. Undercutting of the insoluble pattern by the etchant is unavoidable and virtually impossible to accurately control which introduces variations in the electrical characteristics of each element for which external compensation may be necessary. The only way in which the resistivity of a given current carrying path may be adjusted is by varying the width of the path since the thickness of the film is constant. Furthermore, great care must be exercised in removing the insoluble photoresist pattern after etching to avoid damaging the resulting metal film circuit pattern. It would be advantageous to eliminate the necessity for the use of the photoresist material and the multiple step process attendant therewith.

It is therefore a principal object of this invention to provide a process for etching predetermined patterns in nickel-chromium alloy surfaces which does not require the application of a photoresist mask to the surface of the film.

A further object of the invention is the provision of a method for the selective etching of a nickel-chromium alloy surface at controllably different rates in different zones thereof simultaneously.

Other and specifically different objects of the invention will become apparent to those skilled in the art from the following disclosure.

SUMMARY OF THE INVENTION

Briefly stated, this invention provides a method for the selective etching of nickel-chromium alloy surfaces and particularly of supported thin alloy films by providing a common interface between the alloy surface and an overlying vehicle which carries or contains a photodecomposable material which is nominally inert with respect to the alloy, exposing said interface to a pattern of activating radiation whereby said material is photolytically decomposed to form species which are chemically reactive with the nickel-chromium alloy to form soluble complexes or compounds with the alloy whereupon a pattern is etched in the alloy surface which has a point-to-point correspondence to the pattern of activating radiation and at a rate which is dependent at least in part upon the intensity of the radiation at any given point on the interface. It should be noted that the vehicle may be in either a liquid or solid condition and the soluble products may be directly soluble in the vehicle or dissolved by the subsequent application of another solvent.

DESCRIPTION OF THE PREFERRED EMBODIMENTS

More particularly, the following specific working examples demonstrate the invention in greater detail.

Example 1

A solution of about 0.1 molar N-bromosuccinimide in methanol was prepared. A strip of polyethylene terephthalate resin tape having a film of nickel-chromium alloy about 200/A. in thickness on one surface thereof was placed in a quartz vial and the vial filled with the solution. It may be noted that the nickel-chromium film was evaporated from a heated 80 percent nickel, 20 percent chromium wire under a pressure of about $10^{-6}$ torr and condensed upon the surface of the tape as a uniform coherent film. The vial was exposed to a radiation pattern from a high pressure 150 watt xenon lamp for about 15 minutes at which time the alloy film was completely etched to the substrate in the zones of illumination.

Example 2

The procedure set forth in Example 1 was repeated except that carbon tetrabromide, N,N-dibromodimethylhydantoin, pentabromoethane, ferric chloride, N-chlorosuccinimide, trichloromethane sulfonylchloride, 2-tribromoethylquinoxaline, N,N-dichlorobenzene sulfonamide and N-chlorophthalimide were each substituted for the N-bromosuccinimide. In each case the etching was accomplished.

Example 3

The procedure set forth in Example 1 was repeated except that sodium diethyldithio carbamate was substituted for the N-bromosuccinimide and water was substituted for the methanol. Again the alloy film was etched.

Example 4

A glass slide having one surface coated with an evaporated nickel-chromium alloy about 350 A. in thickness which was applied as set forth in Example 1 was overcoated with a polymeric film about 20 microns thick prepared by casting a solution of 0.2 gram of iodoform in 5.0 cc. of a 10 percent polystyrene resin of about 66,000 average molecular weight in a solvent blend of 50 percent benzene, 30 percent toluene and 20 percent xylene as the solvent. After air drying, the resin coated slide was exposed to a pattern of light and dark zones in a 500 watt tungsten filament projector for 10 minutes. The alloy film was found to be etched to the glass surface in the illuminated zones but was unaffected in the dark zones.

Example 5

The procedure of Example 4 was repeated except that a benzene, plus 1 cc. acetone solvent was used. Etching was again accomplished in the illuminated zones.

Example 6

The procedure of Example 4 was repeated except that N-bromosuccinimide was substituted for the iodoform, chlorobenzene substituted for the solvent and RJ–100 (a hydroxylated polymeric resin manufactured by Monsanto Chemical Corp.) was substituted for the polystyrene. Again, the alloy film was etched in the illuminated zones.

Example 7

A nickel-chromium film about 350 A. in thickness supported upon a glass slide was overcoated with a solution of 0.3 gram of N,N-dibromodiethylhydantoin in 5.0 cc. of a 10 percent of ASB resin (an alcohol soluble butyrate manufactured by Eastman Chemical Products, Inc.) in methyl ethyl ketone with 1 cc. of acetone which after drying left a residual film of 20 microns in thickness. After exposure in the 500 watt projector for 5 minutes, no visible signs of etching were observed. The coated slide was then exposed to methanol and tetrahydrofuran vapors for 5 minutes by placing it on a paper towel saturated with the alcohol and tetrahydrofuran under a watch glass. The alloy film was etched to the substrate in the illuminated zones at the expiration of the time period.

Example 8

A solution of 0.05 gram cupric chloride in 5.0 cc. of 10 percent ASB in methanol was overcoated upon a glass slide supported 350 A. thick nickel-chromium alloy film and air dried to form a 20 micron thick layer. The layer was then exposed for two minutes to methanol vapor, exposed for 30 minutes to a light pattern in the 500 watt tungsten projector. No etching was observable. It was then exposed to methanol vapor for 5 minutes and the illuminated zones of the alloy layer were etched to the glass substrate.

Example 9

A solution of 0.2 gram ferric chloride in 5.0 cc. of a 10 percent AN Gantrez resin (a copolymer of methylvinyl ether and maleic anhydride manufactured by General Analine and Film Co.) was overcoated upon a glass slide supported 350 A. thick film of nickel-chromium alloy and air dried to form a 6 micron thick film. It was exposed to a light pattern in the 500 watt tungsten projector for 5 minutes and at that time the illuminated zones had etched to the glass substrate.

Example 10

A solution of 0.1 gram N-chlorosuccinimide in 5.0 cc. of a 10 percent solution of ASB in methanol plus 1 cc. of acetone was overcoated upon a glass slide supported 350 A. thick film of nickel-chromium alloy and air dried. The film was exposed to methanol vapor for 2 minutes and then exposed to a light pattern for 30 minutes in the 500 watt projector. The illuminated zones were found to be etched to the substrate.

Example 11

A solution of 0.5 gram trichloromethane sulfonylchloride in 5.0 cc. of a 10 percent ASB in methanol plus 1 cc. of acetone and .05 gram of indophenol blue was overcoated upon a glass slide supported 350 A. thick film of the nickel-chromium alloy and oven dried for 5 minutes at 85° C. to form a film 15 microns thick. It was exposed for 5 minutes in the 500 watt tungsten projector with no evidence of etching. It was then exposed to methanol vapor for 5 minutes whereupon the illuminated zones were etched to the substrate.

Example 12

A solution of 0.3 gram N,N-dibromodimethylhydantoin in 5.0 cc. methyl ethyl ketone plus 1 cc. of acetone was overcoated upon a glass slide supported 350 A. film of the nickel-chromium alloy and air dried. The film was then exposed to a light pattern for 5 minutes in the 500 watt tungsten projector with no observable etching. It was then exposed for 3 minutes to tetrahydrofuran vapor and the illuminated zones were etched to the glass substrate. This procedure was repeated with the same results except that the irradiated film was exposed to ethanol vapor for 5 minutes.

The successful etching of nickel-chromium alloy films have been demonstrated for film thicknesses of from 150 A. to 500 A. The thickness of the films are not believed to be critical. Furthermore, by utilizing film transparencies having varying densities or opacities, otherwise called "gray scale," varying rates of etching corresponding to the varying intensities of illumination to which different zones are exposed, different rates of etching are achievable simultaneously.

From all of the foregoing, it will be apparent to those skilled in the art that variations of these specific etching techniques may be readily accomplished within the scope of the invention. Therefore the invention is not intended to be limited except as defined by the following claims.

What we claim as new and desire to secure by Letters Patent of the United States is:

1. The method of photoetching a nickel-chromium alloy comprising the steps of coating a nickel-chromium alloy surface with a vehicle containing a compound which is photodecomposable to form chemically reactive species which combine with the nickel-chromium alloy to form soluble products, wherein said vehicle is a solid film of organic polymeric resin and is exposed to vapors selected from the group consisting of lower paraffin series hydrocarbon alcohols, tetrahydrofuran and mixtures thereof, said compound being selected from the group consisting of N-bromosuccinimide, carbon tetrabromide, N,N - dibromodimethylhydantoin, pentabromoethane, cupric chloride, ferric chloride, N-chlorosuccinimide, trichloromethane sulfonylchloride, 2-tribromoethylquinoxaline, N,N-dichlorobenzene sulfonamide and N-chlorophthalimide, and exposing said coated metal-chromium alloy surface to activating radiation to form said reactive species and forming said soluble products.

2. The method recited in claim 1 in which said vapor exposure step preceeds the step of exposing said film to activating radiation.

3. The method recited in claim 1 in which said vapor exposure step follows the step of exposing said film to activating radiation.

References Cited

UNITED STATES PATENTS 3,346,384 10/1967 Gaynor ------------ 96—36.2

GEORGE F. LESMES, Primary Examiner

J. P. BRAMMER, Assistant Examiner

U.S. Cl. X.R.

96—36.2; 204—157.1